United States Patent
Posseme

(10) Patent No.: US 9,947,768 B2
(45) Date of Patent: Apr. 17, 2018

(54) METHOD FOR FORMING SPACERS FOR A TRANSISTOR GATE

(71) Applicant: Commissariat A L'Energie Atomique et aux Energies Alternatives, Paris (FR)

(72) Inventor: Nicolas Posseme, Sassenage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/185,446

(22) Filed: Jun. 17, 2016

(65) Prior Publication Data

US 2016/0372568 A1    Dec. 22, 2016

(30) Foreign Application Priority Data

Jun. 19, 2015    (FR) ..................... 15 55667

(51) Int. Cl.
| | |
|---|---|
| H01L 21/302 | (2006.01) |
| H01L 21/8238 | (2006.01) |
| H01L 21/336 | (2006.01) |
| H01L 21/461 | (2006.01) |
| H01L 29/66 | (2006.01) |

(Continued)

(52) U.S. Cl.
CPC ...... *H01L 29/6656* (2013.01); *H01L 21/0217* (2013.01); *H01L 21/0234* (2013.01); *H01L 21/02203* (2013.01); *H01L 21/02321* (2013.01); *H01L 21/31111* (2013.01); *H01L 21/31116* (2013.01); *H01L 21/31155* (2013.01); *H01L 21/823468* (2013.01);

(Continued)

(58) Field of Classification Search
None
See application file for complete search history.

(56) References Cited

U.S. PATENT DOCUMENTS 6,335,535 B1    1/2002 Miyake et al.
7,977,249 B1 *  7/2011 Liu ................ H01L 21/31111
                                                    216/79

(Continued)

FOREIGN PATENT DOCUMENTS

EP    2 750 170 A1    7/2014

OTHER PUBLICATIONS

U.S. Appl. No. 14/797,345, filed Jul. 13, 2015, 2016/0020152 A1, Nicolas Posseme.

(Continued)

*Primary Examiner* — Stephanie P Duclair
(74) *Attorney, Agent, or Firm* — Oblon, McClelland, Maier & Neustadt, L.L.P.

(57) ABSTRACT

A method for forming spacers of a gate of a field-effect transistor is provided, the gate being located above a layer of a semiconductor material, the method including forming a dielectric layer covering the gate of the transistor; modifying the dielectric layer by putting the dielectric layer into presence with a plasma formed from a gas formed from at least one first non-carbonated gaseous component of which dissociation generates light ions and a second gaseous component comprising at least one species favoring dissociation of the first component in order to form the light ions, wherein a gas ratio between the first component and the second component is between 1:19 and 19:1.

23 Claims, 8 Drawing Sheets

(51) Int. Cl.
*H01L 21/3115* (2006.01)
*H01L 21/311* (2006.01)
*H01L 21/02* (2006.01)
*H01L 21/8234* (2006.01)

(52) U.S. Cl.
CPC ........... *H01L 21/823864* (2013.01); *H01L 29/66628* (2013.01); *H01L 29/66772* (2013.01)

(56) References Cited

U.S. PATENT DOCUMENTS

| | | | | |
|---|---|---|---|---|
| 2002/0110972 | A1* | 8/2002 | Chen | H01L 21/28273 438/201 |
| 2005/0227446 | A1* | 10/2005 | Kao | H01L 21/2652 438/305 |
| 2006/0220152 | A1* | 10/2006 | Huang | H01L 29/4983 257/408 |
| 2010/0099263 | A1* | 4/2010 | Kao | H01J 37/32357 438/703 |
| 2013/0012032 | A1* | 1/2013 | Liu | H01L 21/3105 438/765 |
| 2014/0187046 | A1 | 7/2014 | Posseme et al. | |
| 2014/0273292 | A1 | 9/2014 | Posseme et al. | |
| 2014/0273461 | A1 | 9/2014 | Lee et al. | |
| 2016/0035581 | A1 | 2/2016 | Posseme et al. | |

OTHER PUBLICATIONS

U.S. Appl. No. 14/142,248, filed Dec. 27, 2013, 2014/0187046 A1, Nicolas Posseme et al.
U.S. Appl. No. 14/997,347, filed Jan. 15, 2016, Nicolas Posseme.
French Preliminary Search Report dated May 12, 2016 in French Application 15 55667, filed on Jun. 19, 2015 ( with English Translation of Categories of cited documents and written opinion).
N. Posseme et al "Alternative process for thin layer etching: Application to nitride spacer etching stopping on silicon germanium", Applied Physics Letters, 105, 2014, 5 pages.

* cited by examiner

Prior Art

| | Ar | He |
|---|---|---|
| IONIZATION PROFILE IN Si$_3$N$_4$ (ION 300eV) | PROFILE 510 | PROFILE 520 |
| Rp | 20 Å | 70 Å |
| Thickness of Si$_3$N$_4$ layer consumed (PLASMA) | 10-20 Å | 20 Å |

| | H |
|---|---|
| IONIZATION PROFILE IN Si$_3$N$_4$ (ION 300eV) | PROFILE 530 |
| Rp | 120 Å |
| Thickness of Si$_3$N$_4$ layer consumed (PLASMA) | 0 nm |

FIG.3

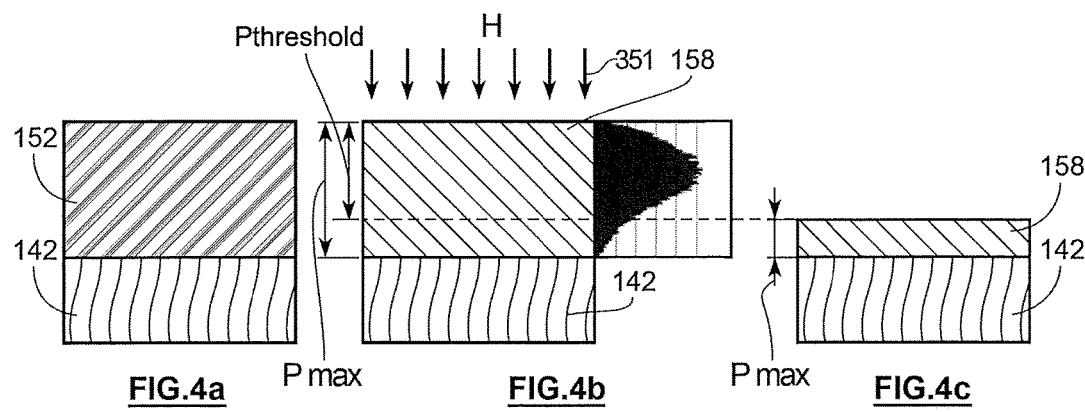
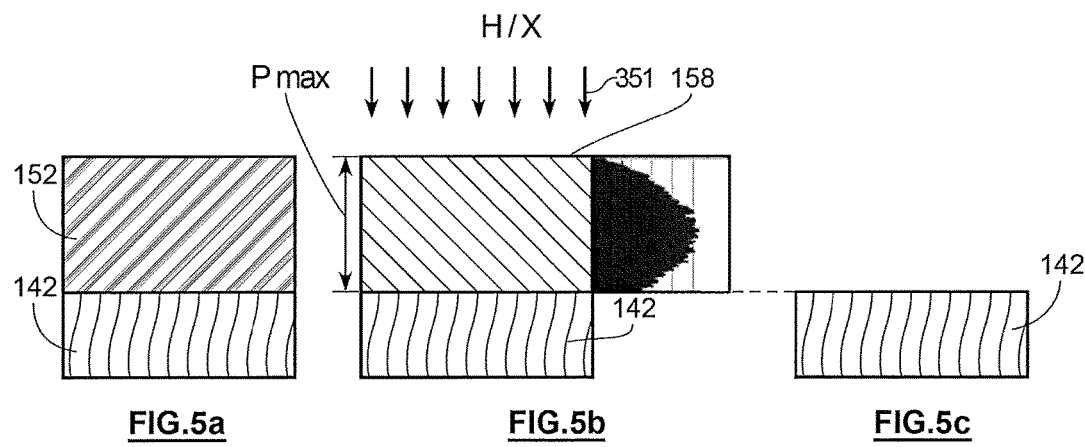

METHOD FOR FORMING SPACERS FOR A TRANSISTOR GATE

TECHNICAL FIELD OF THE INVENTION

The present invention generally relates to field effect transistors (FET) used by the micro-electronic industry and more particularly the production gate spacers for transistors of the metal-oxide-semi-conductor (MOSFET) type, most often contact holes, mainly used for the production of all kinds of integrated circuits.

STATE OF THE ART

The relentless race for a reduction in the dimensions that characterizes the whole microelectronics industry could be achieved only with the constant improvement of key innovations throughout decades of development since the first integrated circuits were produced industrially in the sixties. A very important innovation which dates back to the seventies, and which is still used nowadays, consists in making the MOSFETs using a technique in which the source and drain electrodes are self-aligned on gate ones and so require no photo-etching operation for the definition thereof. Combined with the use of polycrystalline silicon gates, the gates themselves are produced first, and are used as masks during the doping of the source and drain zones of the transistors.

FIG. 1a is a cross-sectional view of an exemplary transistor 100 being produced. It contains the source and drain zones 110, generally designated source/drain zones, since they are usually perfectly symmetrical and can play both roles depending on the electric polarisations that are applied to the transistor. The gate conventionally comprises a stack of layers 120 a large part of which is still made of polycrystalline silicon 123. The source and drain zones are typically formed by ionic implantation 105 of dopants in the zones 110, with the gate 120 being used as masks as mentioned above, thereby preventing doping the MOSFET transistor zone wherein the conduction channel 130 between source and drain will be able to develop, depending on the voltages applied to the gate.

The basic technique, briefly described above, is well known to those skilled in the art as well as many alternative solutions thereof, and has been constantly enhanced in order to improve the electrical performances of the transistors while making it possible to accommodate the successive reductions in the transistor sizes required by an ever-increasing integration of a greater number of components into an integrated circuit.

A currently widely used technique consists in producing the integrated circuit from complex substrates 140 of the silicon on insulator type. The complex SOI substrate is characterized by the presence of a thin surface layer 146 of single-crystal silicon supported by a continuous layer 144 made of silicon oxide, also called buried oxide or still BOX, the acronym for <<buried oxide layer>>. The mechanical solidity and rigidity of the assembly are provided by the layer 142 composing the body of the SOI substrate, also defined as <<bulk>> so as to indicate that the starting substrate is generally made of solid silicon. Such structure is very advantageous for the production of MOSFET transistors. It more particularly enables a drastic reduction of stray capacities because of the presence of the continuous insulating layer 144. As for the invention, it should only be reminded that the single-crystal silicon surface layer 146 can be precisely controlled as regards thickness and doping. In particular, it is advantageous for the performances of the transistors that the channel 130 can be completely deprived of carriers, i.e. "fully depleted" (FD), as such state is generally referred to. This is obtained by producing transistors from SOI substrates the surface layer 146 of which is very thin which may be disadvantageous, as will be seen in the description of the invention. Such type of transistor is thus designated by the acronym FDSOI.

An improvement of the self-aligning basic technique that has been universally adopted consists in forming spacers 150 on the flanks of the gate. The spacers 150, typically made of silicon nitride (SiN), will enable in particular the implementation of a so-called "raised Source and Drain" technique. To keep low electrical resistances of access to the source and drain electrodes, in spite of the reduction in size of the transistors, the sections thereof had to be increased. This is obtained by selective epitaxy of source/drain zones 110. During such operation the initial single-crystal silicon layer 146 will be locally grown. Gate zones must be protected then to prevent growth from the polycrystalline silicon 123 of the gate. This function is ensured, among others, by the spacers. They also ensure the preservation of the gate 120 during the contacts siliconizing (not shown) which is then executed so as to reduce the series resistance of access to the electrodes of the transistor.

Forming spacers 150 is then a crucial step of forming the transistors, which now reach dimensions currently measured in nanometers (nm=10-9 meters) and which globally have decananometric sizes. No photo-etching operation is executed for producing the spacers. They are self-aligned with the gate 120 from the deposition of a uniform silicon nitride layer 152 (SiN) which then undergoes a much anisotropic etching. Such etching of the SiN preferentially attacks the horizontal surfaces, i.e. all the surfaces which are parallel to the plane of the SOI substrate. It only, and imperfectly, leaves the vertical parts of the layer 152, those substantially perpendicular to the plane of the substrate, so as to obtain, in practice, the patterns the ideal shape of which would of course be rectangular.

With the known solutions, the reduction in size of the transistors results in the obtaining of spacers which fully ensure insulation and induce no defects in the production of transistors from SOI substrates becoming a very delicate operation. As a matter of fact, within the scope of the present invention, and as will be explained in greater details hereunder, it could be noted that several types of defects, such as the ones mentioned hereunder, occur during the etching of spacers, while using one or the other known anisotropic etching methods.

FIGS. 1b, 1c and 1d each illustrate a type of defect detected.

A so-called <<dry>> etching is used, which is implemented using a method generally referred to by its acronym RIE, for <<reactive-ion etching>>. In such etching method, plasma which physically and chemically reacts with the surface of the wafer to be etched is formed in a confined enclosure, also referred to as chamber. When etching a silicon nitride layer, which is the preferred material for producing spacers, as mentioned above, the reactive gas is typically methyl fluoride (CH3F) which reacts with the material to be etched after introducing dioxygen (O2). Fluorine chemistry-based etching plasma is thus formed and is often designated by its constituents: CH3F/O2/He. Such plasma fluorine compound is used to etch silicon nitride whereas oxygen makes it possible to limit the polymerisation of methyl fluoride and is also used to oxidise silicon when such material is reached during etching. The oxide layer formed on silicon makes it possible to slow down the etching of silicon, but the price to pay is the transformation of the surface oxide thereof and thus a surface consuming of silicon. Helium is used as a thinner for oxygen.

Such type of etching is advantageous in that it is anisotropic enough and makes it possible to sufficiently control the profiles of the spacers 150 even though the ideal rectangular shape cannot be reached in practice. Such type of etching is disadvantageous in that the selectivity of etching the underlying silicon is limited. Selectivity, i.e. the ratio of etching speed between silicon nitride and silicon is about 10 and may reach a maximum of 15 depending on the plasma forming conditions (nitride is etched 10 to 15 times quicker than silicon).

So called hydrofluoric acid (HF) or phosphoric acid (H3PO4)-based <<wet>> etching is also used, with a much better selectivity, respectively, to silicon or silicon oxide (SiO2) but the profile of the spacers cannot be controlled since etching is mainly isotropic in this case. This etching type is called "wet clean". It should be noted here that many publications exist about etching silicon nitride and/or gate spaces in general. Reference will be made to the following American patents or patent applications: 2003/0207585; U.S. Pat. Nos. 4,529,476; 5,786,276 and 7,288,482.

FIG. 1b illustrates a first problem relating to insufficient selectivity of attack existing during dry etching of the CH3F/O2/He type between silicon nitride and silicon on the surface layer 146. The result is that a significant part of the thin single-crystal silicon surface layer 146 of the SOI substrate can then be partially consumed 147 during the anisotropic etching of nitride. As mentioned above, the surface layer 146 is so selected as to have a low thickness, in order to enhance the electrical characteristics of the transistors. It is typically of less than 10 nm. The remaining thickness 145 may be very low. Under such conditions the following ionic implantation 105 for forming the source and drain zones 110 may significantly damage the remaining single-crystal silicon. The implantation energy of dopants may be sufficient to cause a complete amorphisation 149 of the single-crystal silicon, which will then deeply affect specifically the following step of epitaxial growth 112 intended to form the raised source/drain. As mentioned above, the latter operation is required because of the reduction in the size of the transistors so that the resistances of access to the source and drain electrodes can be kept at sufficiently low values not to impact the electrical operation of the transistors. Growth from a silicon layer partially or totally made amorphous will cause many defects in the layer formed by epitaxy.

FIG. 1c illustrates another problem, wherein no significant consuming of the silicon of the surface layer 146 occurs, but <<feet>> 154 are formed at the lower part of the silicon nitride patterns remaining on the flanks of the gate after etching. The transition 114 of the junctions formed after doping by ionic implantation 105 of the source and drain zones 110 with the channel zone 130, is consequently much less rough than when the spacers have no feet, as shown in the previous figures. The presence of feet 154 affects the electrical characteristics of the transistors. It should be noted here that the forming or not of feet at the feet of the spacers and the consuming or not of the silicon of the silicon surface layer 146 of the SOI substrate, described in the previous figure, are etching antagonist adjustment parameters which require a compromise to be reached wherein, ideally, no feet are formed and the silicon surface layer is not significantly attacked.

FIG. 1d illustrates a third problem which arises when etching causes too important erosion of the spacers in the higher parts of the gates and exposes polycrystalline silicon 123 in such zones 156. This results in the subsequent epitaxial growth 112 aiming at forming raised source/drain also occurring at such places, as well as stray contacts being siliconized, which might cause short-circuits between the electrodes. As a matter of fact, etching spacers requires adjusted etching time to etch 150% of the thickness of deposited nitride, for instance. This means that 50% (here) over-etching is executed so as to take into account the non uniform deposition, or the etching operation proper, on the wafer. Too important over-etching, which exposes the gate zones 156 can thus be noted in some parts of the wafer. Such defect is also called <<facetting>>.

Besides, providing a protective layer, often based on carbon, such as a mask or a photo-sensitive or thermosensitive resin may be required in some applications so as to protect structures formed on the substrate when etching the spacers. This is the case, for instance, when producing PMOS transistors, very similar to NMOS transistors, the spacers of which are being produced. Known etching methods may lead to a significant consuming of such protective layer when etching the spacers of the PMOS transistor.

Other solutions have been proposed in documents US2014/0273292 and FR12/62962. These solutions provides for a step of implantation of the dielectric layer in order to modify it on either side of the gate, followed by a step of removing the modified dielectric layer selectively to the unmodified portions.

In practice, with these solutions, non-optimum performance is observed for the transistor.

The aim of the present invention is to provide a method for forming spacers used as insulators which would eliminate or at least reduce some defects in the production of transistors, such as consuming or altering the semi-conductor material (i.e. Si, SiGe) of the active layer underlying the layer to be etched, forming <<feet>> at the lower part of the patterns on the flanks of a transistor gate, consuming a carbon-based protective layer, etc.

Other objects, characteristics and advantages of the present invention will become apparent upon examining the following description and the appended drawings. It should be understood that other advantages can be incorporated herein.

SUMMARY OF THE INVENTION

In order to achieve this objective, one aspect of this invention relates to a method for forming spacers of a gate of a field-effect transistor, with the gate being located above a layer made of a semi-conductor material, comprising a step of forming a dielectric layer covering the gate of the transistor.

The method comprises, after the step of forming the dielectric layer, at least one step of modifying said dielectric layer by putting the dielectric layer into presence with a plasma comprising light ions. The plasma creates a bombardment of light anisotropic ions along a favored direction parallel to flanks of the gate, the conditions of the plasma, in particular the energy of the light ions and the dose implanted being chosen in such a way as to modify at least portions of the dielectric layer which are located on a top of the gate and on either side of the gate and which are perpendicular to the flanks of the gate by retaining unmodified portions of the dielectric layer covering the flanks of the gate; the light ions being ions with a hydrogen (H) base. The method also comprises at least one step of removing the modified dielectric layer using a selective etching of said modified dielectric layer with respect to the layer made of a semi-conductor material and with respect to the unmodified dielectric layer.

Particularly advantageously, the step of modifying the dielectric layer is carried out by the putting into presence of the dielectric layer with a plasma formed from a gaseous mixture formed from at least one first non-carbonated gaseous component of which the dissociation generates said light ions and a second gaseous component comprising at least one species favoring the dissociation of the first component in order to form said light ions, wherein the gas ratio between the first component and the second component is between 1:19 and 19:1.

As such, the step of modifying the dielectric layer is carried out in a plasma formed from a gaseous mixture formed from at least one first non-carbonated gas of which the dissociation generates said light ions with a hydrogen (H) base and a second gas comprising at least one species favoring the dissociation of the first component in order to form said light ions with a hydrogen (H) base, wherein the ratio between the first gas and the second gas is between 1:19 and 19:1.

Advantageously, the role of the first component is to modify, by ionic bombardment, the crystalline structure of the dielectric layer in order to be able, in what follows, differentiate the initial dielectric layer from the modified dielectric layer. The problem is that if we use a plasma based solely on a single component, hydrogen ($H_2$), for example, the risk is to not uniformly modify the dielectric layer in its thickness. This results in a poor control of the actual depth to where the modified layer has significantly improved selectivity. In this case, the depth of the ionic implantation in the dielectric layer is not equivalent to the thickness of the modified dielectric layer of which the selectivity is significantly improved and which will be etched following the bombardment.

The adding of a second component acting advantageously as a dissociation gas (such as argon, helium, xenon, nitrogen), makes it possible to facilitate the dissociation of the first component and through this bias, to favor the implantation of said first dissociated component in the dielectric layer, in the form of light ions. The dose implanted is therefore higher without however needing to increase the maximum implantation depth.

It is therefore important to find the correct ratio between the content in the first component and in the second component in the plasma intended to modify the dielectric layer. Advantageously, the gas ratio between the first component and the second component is greater than 1:19 and less than 19:1. A lower ratio, which would be the case if the flow rate of the first gas were to be reduced, would result in limiting the effectiveness of the modification of the dielectric film.

A higher ratio, which would be the case if the flow rate of the first gas were to be increased, would result in limiting the effectiveness of the second gas in terms of dissociation. Advantageously, said ratio is between 1:19 and 19:1. Preferably, said ratio is between 1:9 and 9:1. Preferably, said ratio is between 1:5 and 5:1.

In this patent application a ratio between two gaseous components is a ratio concerning the respective flow rates of the introduction of the components into the enclosure of the plasma, typically into the plasma reactor. Each flow rate is usually measured in sccm. Typically a flow rate is measured with a flow meter associated to the reactor.

In the framework of the development of the invention, it was shown to be problematic to target a selectivity threshold depth of the dielectric layer that is equal to the implantation depth. From this, two problems then arise: either the etching of the modified dielectric layer is incomplete which requires repeated steps of etching until the desired depth is obtained, or the implantation carried out in the dielectric layer extends beyond the dielectric layer resulting as such in an alteration of the underlying layer by implantation.

If those skilled in the art had identified these problems, they would at best have reached the following solutions. According ti a first alternative, those skilled in the art would have at best increased the duration of implantation in order to attempt to increase the dose without however increasing the implanted depth. However, increasing the duration of implantation is not a solution, as it results in a constraint from an industrial standpoint (a loss of time which necessarily results in substantial costs). According to a second alternative, those skilled in the art could have increased the flow rate of the light gas, the problem us that an excessive concentration of gas in the reactor would not have for result a more substantial implantation depth. Indeed, beyond a certain proportion of the first gas in the plasma this first gas no longer dissociates. The density of light ions in the plasma and therefore the content in ions implanted no longer increase.

In practice, it is shown that with these solutions the layer underlying the dielectric layer, typically the active layer made of a semi-conductor material is not altered. The performance of the transistor is then not degraded.

Advantageously, the implantation is carried out using a plasma that contains said light ions.

The advantage of implanting from plasma is that it enables a continuous implantation into a volume extending from the surface of the implanted layer.

Besides, using plasma enables an implantation at lower depths than the minimum depths which can be obtained with implanters. Thus, an implantation with plasma makes it possible to efficiently and relatively homogeneously or at least continuously implant thin thicknesses which can then be removed with a selective etching. Such continuous implantation from the implanted face makes it possible to enhance the homogeneity of the modification according to the depth, which leads to a time-constant speed of etching of the implanted layer. Besides, the increase in the selectivity conferred by the implantation as compared to other layers is effective as soon as etching of the implanted layer is started. Plasma implantation also enables a significantly enhanced control of etching accuracy.

The plasma implantation typically makes it possible to implant then to remove thicknesses extending from the surface of the implanted layer and on a depth ranging from 0 nm to 100 nm. Conventional implanters, enable an implantation in a volume ranging from 30 nm to several hundreds of nanometers. However, conventional implanters do not make it possible to implant the species between the surface of the layer to be implanted and a depth of 30 nm. When developing the present invention, it has been noted that the implanters do not make it possible to obtain a sufficiently constant speed of etching of the modified portion, from the surface of the latter, thus leading to less etching accuracy compared to what the invention enables.

Using plasma to modify the portion to be removed is thus particularly advantageous within the scope of the invention which aims at removing a thin thickness of dielectric layer, typically between 1 and 10 nm and more generally between 1 and 30 nm.

The step of modification carried out using a plasma modifies the dielectric layer continuously from the surface of the dielectric layer and over a thickness between 1 nm and 30 nm and preferably between 1 nm and 10 nm.

According to a particularly advantageous embodiment, the implantation and the removal of the dielectric layer are carried out in the same plasma reactor. A modification of the layer to be removed carried out by an implantation by plasma as such makes it possible to carry out the modification of the layer and the etching in the same chamber which is very advantageous in terms of simplification, time and cost of the method.

Particularly advantageously, the modification of the dielectric layer by implantation of light ions, of ions with a hydrogen (H) base, makes it possible to considerably improve the selectivity of this layer with respect to the layer made of a semi-conductor material, typically silicon. This implantation also makes for the thickness of the modified dielectric layer being etched faster than that of the unmodified dielectric layer.

As such, the invention is based in particular on the fact that the second component forming the plasma is able to act as a dissociation gas with respect to the first component, advantageously with a hydrogen base. By favoring the dissociation of the first component, i.e. of the hydrogen, the density of hydrogen ions is increased in the gas phase. As such, for the same implantation energy, the density of the hydrogen contained in the dielectric layer by using the method according to this invention is greater than that obtained using a plasma containing only hydrogen (H2).

Moreover, and particularly advantageously, the consumption of the modified dielectric layer by a cleaning with a hydrofluoric acid base, for example, is close to the ionic implantation depth in said modified dielectric layer. As such, by controlling the implantation depth in the dielectric layer, better accuracy can be had in estimating the thickness of the modified dielectric layer that will be etched after implantation.

Particularly advantageously, this invention allows for a better control of the modification of the dielectric layer and in particular a better estimate of the thickness of the modified dielectric layer, which can be differentiated more strongly from the initial dielectric layer, thanks to a much higher dose of light ions with a hydrogen base implanted in said dielectric layer. As such, the method according to this invention proposes a decrease in the ionic energy for a similar thickness of the dielectric layer, making it possible, particularly advantageously, to reduce the facetting of the hard mask as well as the damages that can be generated on the Si/SiGe stack.

Advantageously, the modification of the dielectric layer is carried out using carbon-free chemistry in such a way as to prevent the formation of a residual layer with a carbon base that would make it difficult to etch the dielectric layer.

The etching consumes the modified dielectric layer preferentially to the layer made of a semi-conductor material and to the unmodified dielectric layer. As such, the risk of excessive consumption of the surface layer of semi-conductor material is reduced and even eliminated.

Preferably, the modification of the dielectric layer retains a thickness of unmodified dielectric on the flanks of the gate. This thickness is retained, at least partially, during the selective etching. It then defines gate spacers.

The invention as such makes it possible to obtain spacers with a dielectric material base while still reducing and even eliminating the problems of the known solutions and mentioned hereinabove.

The invention is particularly advantageous for the forming of spacers of FDSOI transistors for example.

Also advantageously, the modification of the dielectric layer by implantation of light ions such as hydrogen (H) also makes it possible to improve the selectivity of this modified dielectric layer with respect to the oxide of the layer made of a semi-conductor material.

Optionally, the method can further have at least any one of the characteristics and steps hereinbelow.

Preferably, the parameters of the implantation, in particular the implantation energy of the light ions coming from the first component and the implanted dose, are provided in such a way that the modified dielectric layer can be etched selectively with respect to said semi-conductor material and with regards to the unmodified dielectric layer.

According to a preferred embodiment, the etching of the dielectric layer is carried out using a carbon-free chemistry. This advantageously makes it possible to prevent the depositing of a carbon layer that can hinder the etching of the dielectric layer.

Advantageously, the role of the first component is to modify, by ionic bombardment, the crystalline structure of the dielectric layer in order to be able, in what follows, differentiate the initial dielectric layer from the modified dielectric layer. The problem is that if we use a plasma based solely on a single component, hydrogen ($H_2$), for example, the risk is to not uniformly modify the dielectric layer in its thickness. This results in a poor control of the actual depth of the modified dielectric layer. In this case, the depth of the ionic implantation in the dielectric layer is not equivalent to the thickness of the modified dielectric layer which will be etched following the bombardment. Moreover, if the implanted dose of hydrogen is not sufficient then this also results in a non-uniformity of the species implanted in the dielectric layer, causing because of this a poor control of the actual depth of the modified dielectric layer.

The adding of a second component acting advantageously as a dissociation gas (such as argon, helium, xenon, nitrogen), makes it possible to facilitate the dissociation of the first component and through this bias, to favor the implantation of said first dissociated component in the dielectric layer, in the form of light ions.

It is therefore important to find the correct ratio between the content in the first component and in the second component in the plasma intended to modify the dielectric layer. Advantageously, the gas ratio between the first component and the second component is greater than 1:9 and less than 9:1.

According to a preferred embodiment, the first component is chosen from hydrogen (H2), silicon nitride (SiH4), hydrogen nitride (NH3) or hydrogen bromide (HBr).

According to a preferred embodiment, the second component is chosen from helium (He), nitrogen (N2), argon (Ar) or xenon (Xe).

According to a preferred embodiment, during the step of modifying said dielectric layer the entire dielectric layer located on the top of the gate and on either side of the gate is modified.

According to a preferred embodiment, during the step of modifying said dielectric layer the dielectric layer located on the flanks of the gate is not modified.

According to a preferred embodiment, during the step of removing all of the dielectric layer located on the top of the gate and on either side of the gate is removed via etching.

Particularly advantageously, the dielectric layer is formed from one or several dielectric materials of which the dielectric constant k is less than or equal to 8 and preferably to 7. As such, this invention is not limited to a dielectric layer formed from a nitride base. This invention is, moreover, also not limited to a dielectric layer of silicon nitride (SiN). This invention extends advantageously to any spacer comprising a dielectric material with low permittivity k (referred to as "Low-k"). According to an embodiment, the dielectric layer comprises a material that has a dielectric constant less than 4 and preferably less than 3.1 and preferably less than or equal to 2.

The dielectric layer is advantageously a layer with a silicon (Si) base. The material of the dielectric layer is preferably taken from: SiCO, SiC, SiCN, SiOCN, SiCBN, SiOCH, CBN, BN, and SiO2.

According to an embodiment, the dielectric layer is a non-porous layer.

According to another embodiment, the dielectric layer is a porous layer. In the framework of this invention, the term porous layer designates a layer of which the presence of a vacuum in the film is greater than 5% and preferably between 5 and 10%.

According to an embodiment, the dielectric layer is made of silicon nitride and the step of forming the dielectric layer comprises a step of depositing the dielectric layer during which is carried out following a step of reducing the dielectric constant of the dielectric layer. Advantageously, the step of reducing the dielectric constant of the dielectric layer comprises the introduction of a porosity in the dielectric layer. According to another embodiment, the dielectric layer is made of silicon nitride and the step of forming the dielectric layer comprises the introduction of precursors into the dielectric layer in the process of depositing of the precursor formation deposition.

Advantageously, the dielectric layer is a layer with a silicon nitride base and the precursors are chosen in such a way as to form bonds that reduce the polarizability of the dielectric layer. These precursors are chosen in such a way as to generate bonds that are less polar that the silicon nitride, such as Si—F, SiOF, Si—O, C—C, C—H, and Si—CH3.

Preferably, the step of modifying of the dielectric layer carried out using a plasma modifies the dielectric layer continuously from the surface of the dielectric layer and over a thickness between 1 nm (nanometer) and 30 nm, preferably between 1 nm and 10 nm.

Advantageously, the flow rate of the first component is between 10 and 1000 sccm (standard cubic centimeters per minute).

Advantageously, the flow rate of the second component is between 10 and 1000 sccm.

Preferentially, the step of modifying of the dielectric layer is carried out in such a way as to provide a polarization power or source power, at a frequency between 100 Hz (Hertz) and 5 kHz, with an operating cycle between 10% and 90%.

According to an embodiment, the step of modification comprises the putting into presence of the dielectric layer with a plasma comprising the light ions in an etching reactor.

The term "light ions" means ions coming from materials of which the atomic number in the periodic table of the elements is low. Generally, all of the elements that can be implanted in a material to be etched, without provoking a dislocation of its atomic structure such that it would result in a pulverization of the latter, and therefore without a re-depositing of the material etched on the walls of the reactor or the patterns during the etching itself, can be suitable.

Preferably, the light ions are taken from hydrogen (H2).

According to an embodiment, the step of removing the modified dielectric layer is carried out by selective wet-etching on the layer with a semi-conductor material. Preferably, the semi-conductor material is silicon and the step of removing the modified dielectric layer is carried out by selective wet-etching with silicon (Si) and/or silicon oxide (SiO2). Preferably, the selective etching with silicon is obtained using a solution with a hydrofluoric acid (HF) base or using a solution with a phosphoric acid (H3PO4) base for a dielectric layer with a silicon nitride (SiN) base.

According to another embodiment, the step of removing is carried out by selective dry-etching on the layer with a semi-conductor material. Preferably, the layer made of a semi-conductor material is silicon. Preferably, the step of removing the modified dielectric layer is carried out by selective dry-etching with silicon (Si) and/or silicon oxide (SiO2). According to an embodiment, the dry etching is carried out in a plasma formed in a confined enclosure from a mixture of nitrogen trifluoride (NF3), hydrogen (H2) or ammonia (NH3) in order to form hydrofluoric acid (HF).

Advantageously, the dry etching comprises: a step of etching consisting in the forming of solid salts; a step of sublimation of the solid species. This embodiment makes it possible to obtain a very good selectivity of the etching of the modified dielectric layer with respect to the unmodified dielectric layer and with the unmodified semi-conductor material. In particular, this selectivity of the etching is much higher (typically by a factor of 10 at least) to that obtained with an HF solution.

Preferably, a single step of modifying is carried out in such a way as to modify the dielectric layer in all of its thickness over all of the surfaces parallel to the plane of a substrate whereon the gate rests and to not modify the dielectric layer in all of its thickness on the surfaces parallel to the favored direction of the bombardment.

Advantageously, the light ions include ions with a hydrogen (H2) base taken from: H, H+, H2+, H3+. According to another embodiment, the light ions include ions with a hydrogen (H2) base taken from H, H+, H2+, H3+

Advantageously, the implantation is carried out in such a way as to modify all of the thickness of the dielectric layer outside of the dielectric layer deposited on the flanks of the gate. As such, the etching removers all of the dielectric layer except a portion at least of the dielectric layer located on the flanks of the gate.

Advantageously, the thickness of the modified dielectric layer on the flanks of the gate is zero or is less than the thickness of the dielectric layer before modification by implantation.

Advantageously, the implantation modifies the dielectric layer from its surface and to the depth corresponding to a portion at least of its thickness. Preferably, the implantation modifies the dielectric layer in an uninterrupted manner from the surface.

According to a particular embodiment, the method comprises a single step of modifying carried out in such a way as to modify the dielectric layer in all of its thickness over all of the surfaces parallel to the plane of a substrate whereon the gate rests and to not modify the dielectric layer in all of its thickness on the surfaces perpendicular to this plane. These surfaces perpendicular to this plane, i.e. perpendicular to the layer made of a semi-conductor material forming a conduction channel or to the solid substrate are typically parallel to the flanks of the gate of the transistor. As such, following this single step of modifying, a selective etching of the modified dielectric layer makes it possible to remove the dielectric layer on all of the surfaces except on those partial to the flanks of the gate.

According to another embodiment, the method comprises several sequences each comprising a step of modifying and a step of removing. During at least one of the steps of modifying, only a portion of the thickness of the dielectric layer is modified. Advantageously, the sequences are repeated until disappearance of the dielectric layer on all of the surfaces parallel to the plane of a substrate whereon the gate rests. Only the faces parallel to the flanks of the gate retain a thickness of dielectric, with this thickness not having been the object of modification via implantation.

According to an advantageous embodiment, the dielectric layer is arranged directly in contact with the layer made of a semi-conductor material. Preferably the dielectric layer is arranged directly in contact with the gate which is preferably formed in a semi-conductor material.

Advantageously, the gate of the transistor is located on a stack of layers forming an elaborated substrate of the silicon on insulator (SOI) type. Preferably, it is arranged directly in contact with the layer forming the conduction channel. Advantageously, the use of the invention with such a SOI substrate makes it possible to preserve the entire surface layer of very low thickness which forms the conduction channel of a transistor formed from a SOI substrate.

Advantageously, the semi-conductor material is silicon. Advantageously, the etching is selective with silicon oxide ($SiO_2$). The semi-conductor material can also be germanium (Ge) or silicon-germanium SiGe. The step of removing the modified dielectric layer is carried out by selective wet-etching with Ge or with SiGe or and/or with SiGe oxide or with Ge oxide.

According to an embodiment, the transistor is a transistor of the FDSOI type. Preferably, the method comprises a step of completely removing of the dielectric layer outside of the flanks and on either side of the gate in order to expose the layer made of a semi-conductor material and a step of forming of source and drain zones from the layer made of a semi-conductor material, for example by epitaxy.

Another aspect of this invention relates to a method for etching a dielectric layer selectively with silicon (Si) and/or with silicon oxide (SiO2) comprising:
  at least one step of modifying all or a portion of the dielectric layer by implantation of light ions such as hydrogen (H2) in the dielectric layer in order to form a modified dielectric layer;
  at least one step of removing the modified dielectric layer using a selective etching of the modified dielectric layer with respect to silicon (Si) and/or silicon oxide (SiO2).

Advantageously, the implantation in particular its energy, the concentration and the type of the light ions, the dose used and the duration of the method of implantation, are provided in such a way that the modified dielectric layer can be etched selectively with regards to the dielectric layer, i.e. to the unmodified dielectric layer.

Advantageously, the modification of the dielectric layer of silicon by implantation of hydrogen (H2) makes it possible to improve the selectivity of this layer with respect to the silicon and/or to the silicon oxide.

Preferably, the etching is obtained, for example, using a solution with a phosphoric acid (H3PO4) base for a dielectric layer 152 with a silicon nitride base or using a solution with a hydrofluoric acid (HF) base.

BRIEF DESCRIPTION OF THE FIGURES

The goals and objectives as well as the characteristics and advantages of the invention will better emerge from the detailed description of an embodiment of the latter which is illustrated by the following appended drawings wherein:

FIG. 3 shows the ionic implantation profiles obtained for various doping species in a layer of silicon nitride, with an energy of 300 eV.

FIGS. 4a, 4b and 4c show an embodiment wherein a dielectric layer 152, formed on a substrate 142, is modified then removed by etching using a method according to prior art.

FIGS. 5a, 5b and 5c show an embodiment wherein a dielectric layer 152, formed on a substrate 142, is modified then removed by plasma etching using a method according to an embodiment of the invention.

The drawings attached are given as examples and are not limiting to the invention. Such drawings are schematic representations and are not necessarily to scale with a practical application. More particularly, the relative thickness of the various layers and substrates are not a representation of reality.

DETAILED DESCRIPTION OF THE INVENTION

It should be noted that, within the scope of the present invention, the words "on", "over" or "underlying" or the equivalents thereof do not necessarily mean "in contact with". Thus, for instance, depositing a first layer on a second layer does not necessarily mean that the two layers are directly in contact with each other, but this means that the first layer at least partially covers the second layer by being either directly in contact therewith or by being separated therefrom by another layer or another element.

In the following description, thickness is generally measured in directions perpendicular to the plane of the lower face of the layer to be etched or of a substrate whereon the lower layer has been deposited. Thickness is thus generally measured along a vertical direction in the figures shown. On the contrary, the thickness of a layer covering a flank of a pattern is measured along a direction perpendicular to such flank.

FIGS. 2a to 2d show the steps of a detailed example of the method according to the invention applied to the carrying out of transistors of the FDSOI type. The principles of these steps can also apply to the forming of spacers on the flanks of a gate of another type of transistor.

Figure 2A:
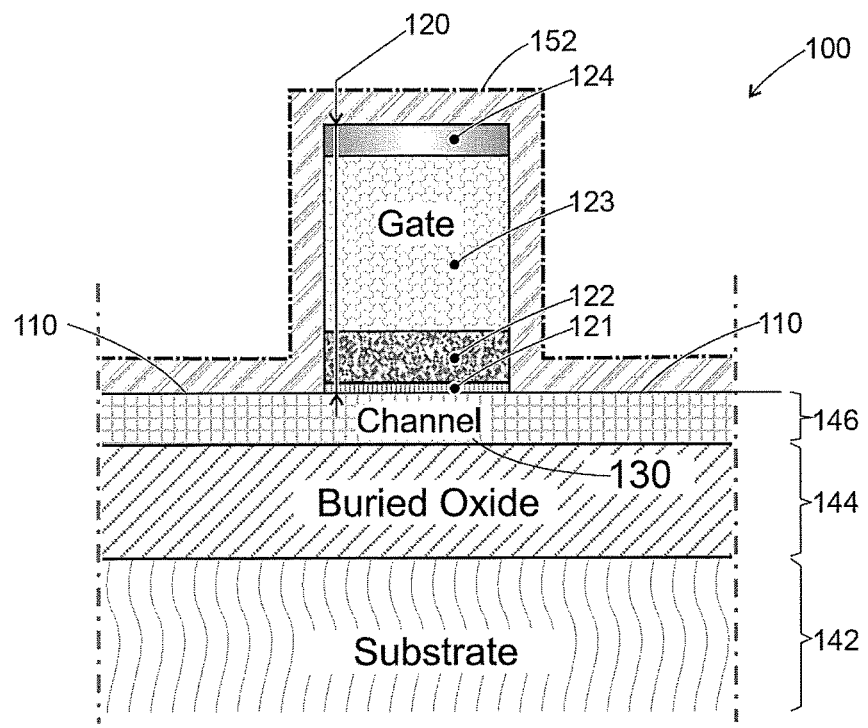
FIGS. 2a to 2d show the steps of an example of the method according to the invention applied to the carrying out of transistors of the FDSOI type.

FIG. 2a shows the step of depositing a dielectric layer 152, of a thickness that is preferentially substantially uniform, over all of the surfaces, vertical and horizontal, of the devices during manufacture. This step is carried out preferably using a method of depositing called LPCVD (low pressure chemical vapor deposition). This type of deposition which is practices under atmospheric pressure indeed makes a uniform deposition it possible on all of the surfaces regardless of their orientation.

Although not necessary for the understanding of the method of the invention, note that the gate electrode is in this example comprised at this stage of the method of several layers for certain types of transistors. Other than the layer of polycrystalline silicon 123, there is in the stack of layers forming the gate 120 first of all the thin insulating layer of gate oxide 121 through which an electric field will be able to develop in order to create the underlying conduction channel 130 between source and drain when sufficient electrical voltage is applied to the gate. With the most recent MOSFET transistors a technology is implemented qualified as "high-k/metal gate" i.e. the insulating layer 121 is made from an insulating material with high permittivity (high-k) covered by a metal gate represented by the layer 122. This technology was developed in particular in order to reduce the leakage currents through the gate which were becoming much too substantial due to the decrease in the thickness of the insulating layer 121 to atomic dimensions. At this stage, the stack of layers of the gate also comprises a protective hard mask 124 which will be removed later in order to allow for the putting back into contact on this electrode. This hard mask, which remains in place after etching of the gate, is typically made of silicon oxide ($SiO_2$). Its role is to protect the top of the gate from any damage during the etching of the spacers.

Preferably, the insulating layer 121 is arranged in contact with the layer 146 made of a semi-conductor material, forming the conduction channel. Preferably, the layer 122 is arranged in contact with the layer 121. Preferably, the layer 123 is arranged directly in contact with the gate oxide formed by the layer 121, if the layer 122 is absent or is arranged directly in contact with the layer 122. Preferably, the dielectric layer 152 is arranged directly in contact with the layer 123 on the flanks of the gate. Preferably, the dielectric layer 152 is arranged directly in contact with the layer 146 made of a semi-conductor material intended to form the conduction channel.

According to an embodiment, the dielectric layer 152 has a nitride base. According to an embodiment, the dielectric layer 152 of nitride has a thickness between 5 and 20 nm, and typically of about 10 nm. According to another embodiment, the dielectric layer 152 has a silicon nitride (SiN) base. According to another embodiment, the dielectric layer 152 comprises a dielectric material with a low permittivity k (or with a low dielectric constant k), with preferably k less than or equal to 7. As such, this invention is not limited to a dielectric layer formed from a nitride base. This invention is, moreover, also not limited to a dielectric layer of silicon nitride (SiN).

This invention extends advantageously to any spacer comprising a dielectric material with low permittivity k (referred to as "low-k"). The term "permittivity of a material" means, at a microscopic level, the electrical polarizability of the molecules or atoms constituting said material. The permittivity of a material is a tensor magnitude (the response of the material can depend on the orientation of the crystallographic axes of the material), which is reduced to a scalar in isotropic mediums. The dielectric constant is noted as k in the field of integrated circuits and semi-conductors, for example. The materials referred to as "low-k" are dielectrics with a low permittivity. They are used as insulators between the metal interconnections in order to reduce the coupling between the latter.

In an embodiment, the dielectric layer 152 has or comprises a material that has a dielectric constant less than 4 and preferably less than 3.1 and preferably less than or equal to 2, which as such makes it possible to reduce the parasite capacity in order to possibly improve the performance of the transistor For example, the material of the dielectric layer is preferably taken from: SiCO, SiC, SiCN, SiOCN, SiCBN, SiOCH, and $SiO_2$. This makes it possible to reduce the parasite capacity and consequently to improve the performance of the transistor.

Preferentially but only optionally, the method of the invention comprises an optional step of reducing the dielectric constant of the dielectric layer 152. According to an advantageous embodiment, the reduction of the dielectric constant is obtained during the step of depositing of the dielectric layer 152.

According to an embodiment, the reduction in the dielectric constant comprises the introduction into the dielectric layer 152 in formation of precursors that form bonds reducing the polarizability of the dielectric layer 152. These precursors are chosen in such a way as to generate bonds that are less polar that the silicon nitride, such as Si—F, SiOF, Si—O, C—C, C—H, and Si—CH3.

According to another embodiment, alternative or combinable with the previous one, the reduction in the dielectric constant comprises the introduction into the dielectric layer 152 in formation of a porosity.

Figure 2B:
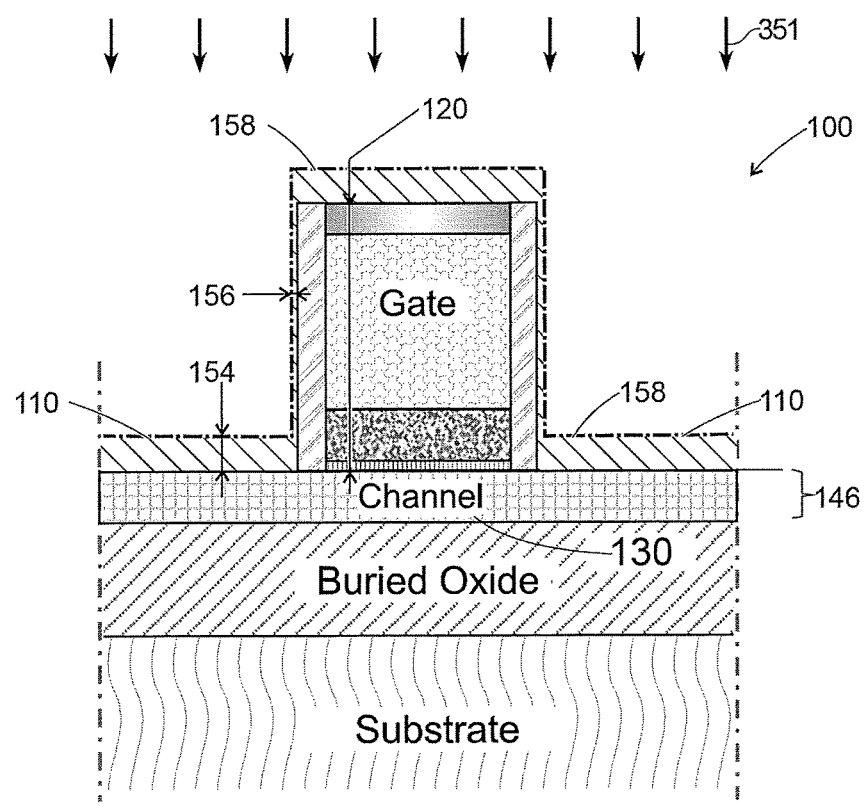

FIG. 2b shows the following step of the invention applied to the carrying out of FDSOI transistors in which we proceed directly with a modification 430 of the dielectric layer 152 that has just been deposited. Optionally, this operation can have been preceded by a conventional dry etching of the CH3F/O2/He type.

The step of modification 430 of the dielectric layer 152 such as deposited, or of the layer remaining after a first conventional etching, is done by implantation 351 of light species also designated as light ions. In the framework of this invention, these ions are ions with a hydrogen (H) base. These ions can be implanted in a material to be etched, without provoking any dislocation of its atomic structure such as would result from a pulverization of the latter.

Typically, the modification of the dielectric layer 152 to be etched is based on the implantation of light species with a hydrogen (H) base such as: H, H+, H2+, H3+.

Particularly advantageously, the implantation of light species is favored by the incorporation into the plasma of a second component allowing for the dissociation of the light ions and therefore the increase in the density of light ions in the plasma and the increase of the implanted dose. These aspects will be described in detail in what follows in reference to FIGS. 3, 4 and 5.

Advantageously, the implantation parameters, in particular the energy communicated to the ions, the duration and the dose of implantation are provided in such a way that the modified dielectric layer 158 can be selectively etched with respect to the layer 146 made of a semi-conductor material.

Advantageously, these parameters are also configured in such a way that the modified dielectric layer 158 can be selectively etched with respect to an unmodified portion of the dielectric layer 152.

Advantageously, these parameters are also configured in such a way that the modified dielectric layer 158 can be selectively etched with respect to the layer made with an oxide typically an oxide of said semi-conductor material, with the latter forming for example a layer of gate oxide. Typically, the etching is selective of the modified dielectric material by implantation of hydrogen with respect to silicon oxide.

The implantation is carried out for example in a plasma with a gaseous hydrogen (H2) base. More generally, all of the gaseous components, able through dissociation to release the light ions mentioned hereinabove, can be used in the plasma. Note here that this step of modifying 430 of the dielectric layer 152 to be etched can be practiced in many different ways by adapting all sorts of means currently used in the microelectronics industry. In particular, standard etching reactors are used in which can be carried out low or high density plasmas and wherein the energy of the ions can be controlled in order to allow for the implantation of the light species hereinbelow intended to modify the layer to be etched. A type of plasma referred to as immersion that is commonly used to carry out an implantation of species on the surface of a device being manufactured can also be used. Finally, the implantation can also be carried out in an standard implanter where the ions are accelerated in an electric field in order to obtain their implantation in a solid.

The modification operation is advantageously very anisotropic for the carrying out of spacers on the flanks of the gates due to the directionality of the ions of the plasma or of the implanter. It therefore preferentially affects the horizontal surfaces, i.e. all the surfaces parallel to the plane of the SOI substrate 142. The modified thickness of the horizontal surfaces 154 is as such clearly more substantial than the vertical surfaces 156 i.e. on all of the surfaces perpendicular to the plane of the elaborated substrate 146, on which the gate is arranged. This plane is perpendicular to the plane of the section shown in FIGS. 2a to 2d. The elaborated substrate 142 preferably forms a plate with two parallel faces. It has for example the form of a disk, a square, a polygon, etc. The thin layer 146, the layer of buried oxide 144 and the solid substrate 142 are arranged according to parallel planes. As such, a surface shall be qualified as horizontal if it is parallel to the plane of the layer or layers forming the substrate 146, whereon the gate is formed and a surface shall be qualified as vertical if it is perpendicular to this same plane.

Typically, a thickness 154 of 10 nm on the horizontal surfaces can be modified during this operation. A thickness 156 of the layer 152 ranging from 1 to 3 nm is however also modified on the vertical surfaces regardless of the conditions of the plasma. These vertical surfaces with respect to the plane of the substrate 146 are therefore parallel to the flanks of the gate. The modified thicknesses depend on the conditions of implementation, in particular the means employed (plasma or implanter) and also on the fact that it is desired to obtain the etching of the spacers in a single step of modifying and of etching or on the contrary these operations are repeated until a complete etching is obtained.

As such, according to the particular implementations of the method of the invention and of the initial thickness of the dielectric layer 152, the step of modifying this layer can affect all of this layer wherein, as shown in the example in FIG. 2b, only a portion of the layer. In this case, the step of modifying 430 and the step of removing 440 the modified layer described hereinafter can be repeated until the complete removal of the dielectric material of the modified dielectric layer 158 on all of the horizontal surfaces.

Figure 2C:
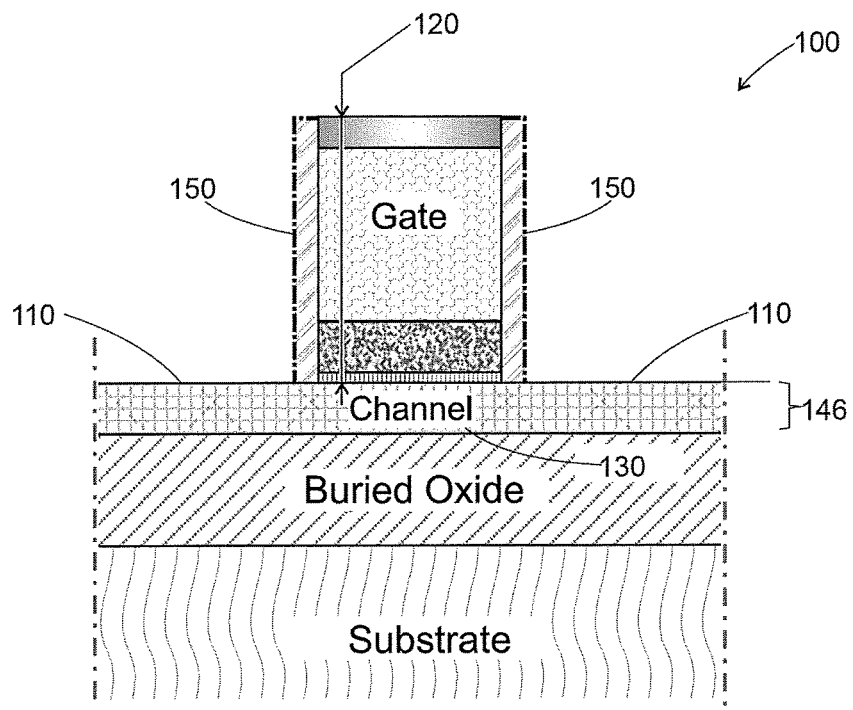

FIG. 2c shows the final result of the following step after having proceeded with the etching, i.e. with the removal of the modified dielectric layer 158 and possible repeated, on the one hand, the operation of modification described in the preceding figure, and on the other hand, the operation of removing the modified dielectric layer 158.

A method used for the removal of the modified dielectric layer 158 consists, as already mentioned, in using a solution of etching, for example, with an hydrofluoric acid (HF) base (or phosphoric acid (H3PO4) for a dielectric layer 152 with a silicon nitride base). The stopping of the etching is carried out on the unmodified dielectric layer 152 or on the monocrystalline silicon of the layer 146 or on the hard mask 124 on the top of the gates. Note here, in reference to the problem described in FIG. 1b, that there is no consumption of silicon due to the use of hydrofluoric acid or phosphoric acid. Moreover, an optimization of the step of modifying 430 via implantation of light species described hereinabove only results in a modification of the dielectric layer 152 and the operation of etching that follows therefore does not affect the underlying silicon. As such, as shown, there is very advantageously no consumption in the S/D zones 110 of the silicon layer 146.

At the end of these operations there remains therefore of the initial dielectric layer 152 only vertical patterns, substantially on the flanks of the stack of layers that form the gate 120. They constitute spacers 150 of the gate of the transistor.

Figure 2D:
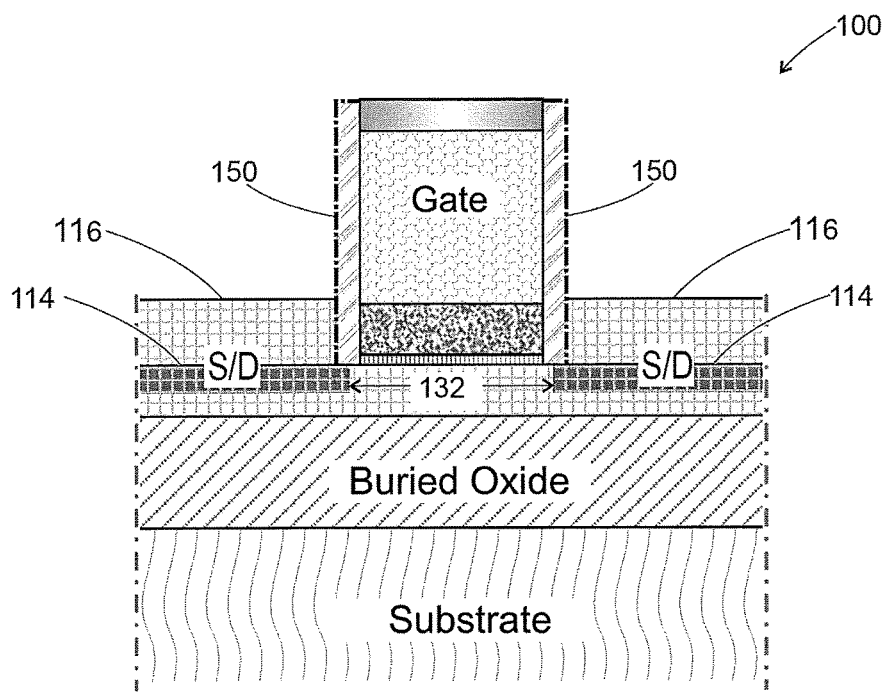

FIG. 2d shows the formation of the drain and source zones of a transistor of the FDSOI type.

At the end of the last or only step of removing of the modified dielectric layer 158, i.e. when removing on all of the horizontal surfaces has been completed, a cleaning operation is carried out referred to as "wet cleaning" which is most often referred to as "wet clean". As have already been noted hereinabove, wet etching and wet cleaning are similar operations that can advantageously be combined into a single operation.

The formation of the source and drain electrodes 110 can then be carried out. As has already been mentioned, the doping that will delimit source and drain and therefore the length of the channel 132 can be carried out by ionic implantation before proceeding with an epitaxial growth on these zones in order to increase their section and reduce their resistance. If the doping is carried out before the epitaxial growth, as shown in FIG. 2d, the method is referred to as "first extension" used to indicate that the extensions (of source and of drain under the spacers) are carried out first, i.e. before the epitaxial growth. In the opposite case which is referred to as "last extension", we proceed directly with the step of epitaxial growth without prior doping. The doping of the source/drain zones is carried out only after epitaxial growth of these zones. In the case of transistors with a channel of the n type (nMOS), the dopants implanted are typically arsenic (As) or phosphorus (P). For transistors with a channel of the p type (pMOS) the dopants are boron (B) or boron difluoride (BF2).

The result is illustrated in FIG. 2d which shows the doped source/drain zones 114 before epitaxial growth of the raised source/drain zones 116.

FIG. 3 shows the ionic implantation profiles obtained for various doping species (Argon, Helium, Hydrogen) in a layer of silicon nitride, with an energy of 300 eV.

In order to chose the best species of ions in order to modify a layer of silicon nitride of a thickness of about 10-20 nm, the profile of a range of Rp ions ("Ion projected range") is carried out using a layer of silicon nitride (SiN) by using typical conditions of plasma, making it possible to compare different species of ions, in particular argon (curve 510), helium (curve 520), hydrogen (curve 530), hydrogen associated with another component (curve 540). The Monte Carlo simulation code of the SRIM type (Stopping And Range of Ions), developed by Ziegler, has been used for estimating and elaborating the Rp profile. In this example, a layer of silicon nitride with a thickness of about 50 nm is considered. It is preferred that the ions (argon, helium, hydrogen, hydrogen associated with another component), having a kinetic energy of 300 eV, reach the surface of the plate (corresponding to the self-polarization in direct current, measured at the surface of the plate (−300 V)). The simulated Rp profile, shown in FIG. 3, is estimated between 2 nm, 7 nm and 12 nm by using, respectively, a plasma with a base of argon 510, helium and hydrogen 530.

In a plasma with an argon 510 or helium 520 base, the consumption of the layer of silicon nitride is estimated at 2 nm·min$^{-1}$ in the experimental conditions of this example. Consequently, the degradation of the SiN layer, generated by the ions, is suppressed, as it is formed by the rate of the cathodic pulverization of argon. When a plasma with a helium 520 base is used, the ionic implantation is deeper. As such, the modified degraded layer can be adjusted, taking into account the consumption of said layer.

Advantageously, a plasma with a hydrogen 530 base does not etch the layer of silicon nitride. Consequently, the use of a hydrogen plasma offers a wider method window than helium, making it possible to modify more accurately and in a more controlled manner the depth of the modified layer of silicon nitride. Based on these results, it therefore appears that a plasma preferably with a hydrogen base offers a particularly interesting means for the precise control of the etching depth.

Moreover, the impact of the polarization power on the thickness of the modified layer of silicon nitride $Si_3N_4$, after a plasma with a hydrogen base (with a flow rate of 300 sccm), with a duration of 60 seconds, was studied by using a plasma with a capacitive coupling by varying the polarization power between 0 and 500 W with a pressure set to 50 mTorr. A cleaning with a hydrofluoric acid (HF) base at 1% was carried out in order to remove the modified layer. It was observed that an increase in the polarization power results in an increase in the depth of the modification of the $Si_3N_4$ layer, which is correlated with a higher ionic energy according to the polarization power.

FIGS. 4a, 4b and 4c show an embodiment according to prior art wherein a dielectric layer 152, formed on a substrate 142, is modified then removed by plasma etching with a hydrogen base only. FIGS. 5a, 5b and 5c show an embodiment according to the invention wherein a dielectric layer 152, formed on a substrate 142, is modified then removed by plasma etching with a hydrogen base associated with another component X, playing the role of a dissociation gas.

In the framework of the dopant of this invention, it has been observed that there is a threshold value for the dose of hydrogen starting from which the dielectric layer 152 is sufficiently modified in order to be attacked by means of a cleaning with an hydrofluoric acid base, for example, or in the very least, in order to be etched with a high selectivity with regards to the unmodified material of the dielectric layer 152. If the material of the dielectric layer 152 is modified without the dose being at least equal to this threshold dose, then the modified material of the dielectric layer 152 will not be etched or will be etched with a low selectivity with regards to the unmodified material.

However, with a plasma implantation, the known solutions do not make it possible to achieve this threshold dose for the maximum implanted depth. Indeed, beyond the depth at which the threshold dose is reached, there is a depth of about 3 to 5 nm, which is implanted but without however having an implanted dose greater than or equal to the threshold dose.

This phenomenon is shown in FIGS. 4a to 4c. After an implantation using a plasma with a hydrogen base only, the dielectric layer 152, in this example formed from a silicon nitride base, is implanted by light H ions, for example. However, and as shown on the implantation profile, the modified dielectric layer 158 is not implanted uniformly over the entire maximum depth Pmax of the dielectric layer 152. As such, only a portion of the dielectric layer 152, over a threshold depth Ps is implanted with a dose greater than or equal to the threshold dose sufficient to be able to authorize a selective etching of the modified dielectric layer 158.

The HF cleaning carried out after implantation then makes it possible to remove only the portion of the modified dielectric layer 158 that comprises a sufficient dose of light ions, which is the portion having a Pthreshold depth. After the HF cleaning, there is still therefore a portion (depth Prest=Pmax−Pthreshold) of the modified dielectric threshold 158 comprising an insufficient dose of light ions and no longer being because of this removed by a HF cleaning. An additional etching cycle will then be necessary in order to remove the remaining modified dielectric layer 158.

In order to make the residual layer 158 disappear without an additional etching cycle, it would have been necessary to have Pthreshold equal to the thickness of the initial dielectric layer 152. Pmax would then have been thicker than the thickness of the initial dielectric layer 152. The Prest portion would have been contained in the layer 142. The latter would therefore have been implanted on a thickness corresponding to Prest which would have altered it.

A way to increase the dose H of ions in the layer of silicon nitride is to increase the treatment time. The problem is the substantial consumption of time (>600 s) that is required to saturate the hydrogen in the SiN layer. This solution, due to the substantial amount of time that it requires, therefore cannot be implemented from an industrial standpoint (high cycle time, today the treatment time for the etching of a spacer in nitride is less than 60 s).

A problem to be solved is the removal of the modified layer, since the modified layer is removed by HF cleaning starting only from a threshold value of a dose of light ions implanted in the nitride layer. Consequently the damages caused in the layer of nitride by the HF cleaning is underestimated. As such, if we target a removal of the thickness of the silicon nitride layer of 15 nm with an HF cleaning 1%, the risk is to damage the underlying layer (Si or SiGe), since the ionic implantation depth will be deeper than 15 nm.

Advantageously, this invention allows for a better control of the modification of the dielectric layer 152 (thanks to a higher dose of H implanted in the SiN layer) and therefore by a decrease in the energy of the ions (reduction in the damage that can affect the underlying Si/SiGe layers). FIGS. 5a to 5c show an embodiment according to this invention wherein the method makes it possible to modify the dielectric layer 152 in such a way that this modified dielectric layer 158 is implanted on the Pmax depth with a dose greater than the threshold dose, as such authorizing a precise etching of the modified dielectric layer 158 over the entire Pmax depth.

In particular, it is observed that the use of a second component acting as a dissociation gas X (with X chosen for example from: Ar, He, Xe, N2) with the chemistry of the first component H2, advantageously makes it possible to increase the concentration of the light ions in the gas phase. Consequently, for the sale implantation energy, the H dose implanted in the SiN layer is greater than that obtained using a plasma with a base of a single component H2 only. The Rp profile (associated with the implantation depth) for an implantation using a plasma with a base of a gas comprising at least one first non-carbon gas component (H2) and a second component (X with X chosen for example from: Ar, He, Xe, N2) of dissociation gas close to the one obtained for an implantation with a base of a single component H (cf. FIG. 3). Only the dose implanted will be more substantial in the case of a plasma comprising a first component H and a second component X compared to a plasma comprising solely hydrogen for example. In this way, it is possible to reach the threshold implantation dose at the maximum depth Pmax at which the light ions are implanted. There is therefore no longer any residual implanted thickness of which the dose is less than the threshold dose. As such, the consumption of the modified dielectric layer 158 by the HF cleaning is close to the implantation depth Pmax of the ions. Particularly advantageously, a better precision for etching the dielectric layer 152, without however damaging the underlying layer.

Figure 1A:
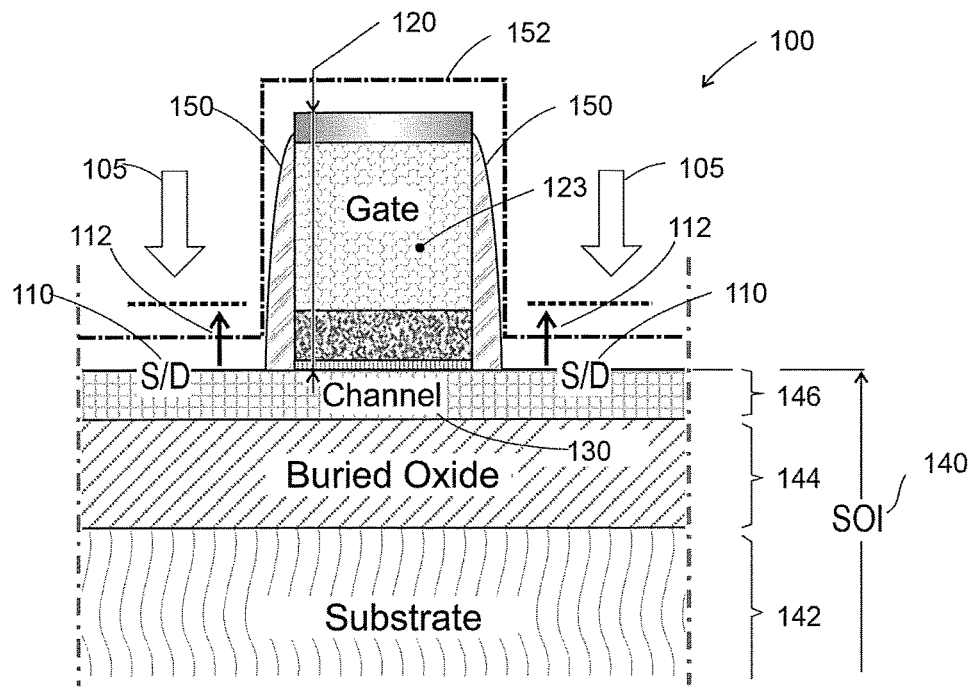
FIGS. 1a to 1d show, on the one hand, a cross-sectional view of an exemplary MOSFET transistor of the FDSOI type being produced and, on the other hand, illustrate different defects which may be observed on FDSOI transistors structures upon etching spacers using either one of the standard anisotropic etching methods developed by the microelectronics industry.
Figure 1B:
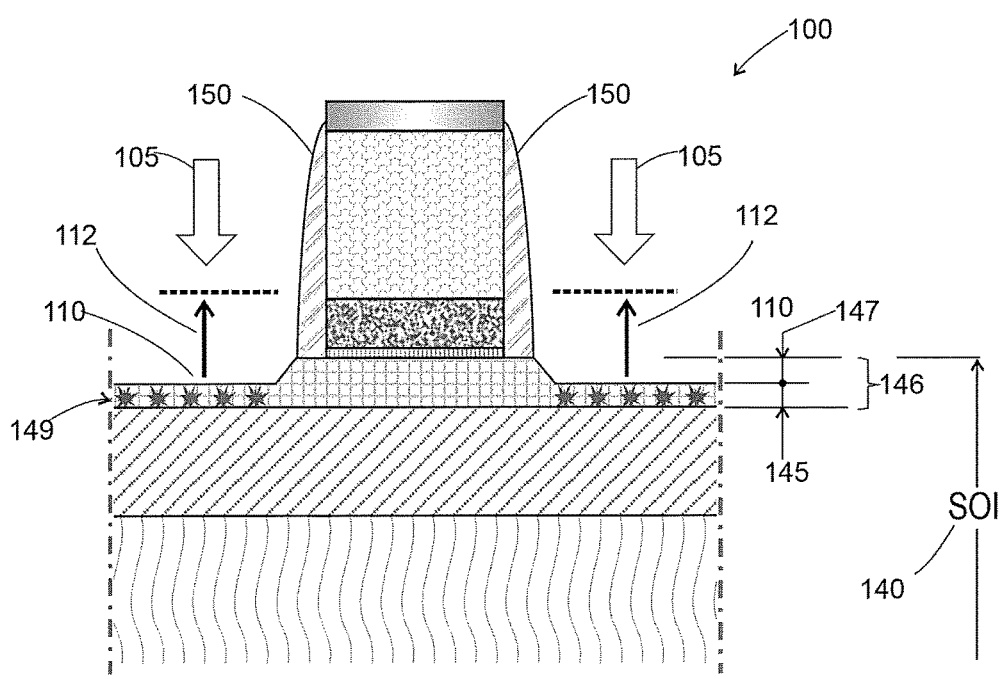
Figure 1C:
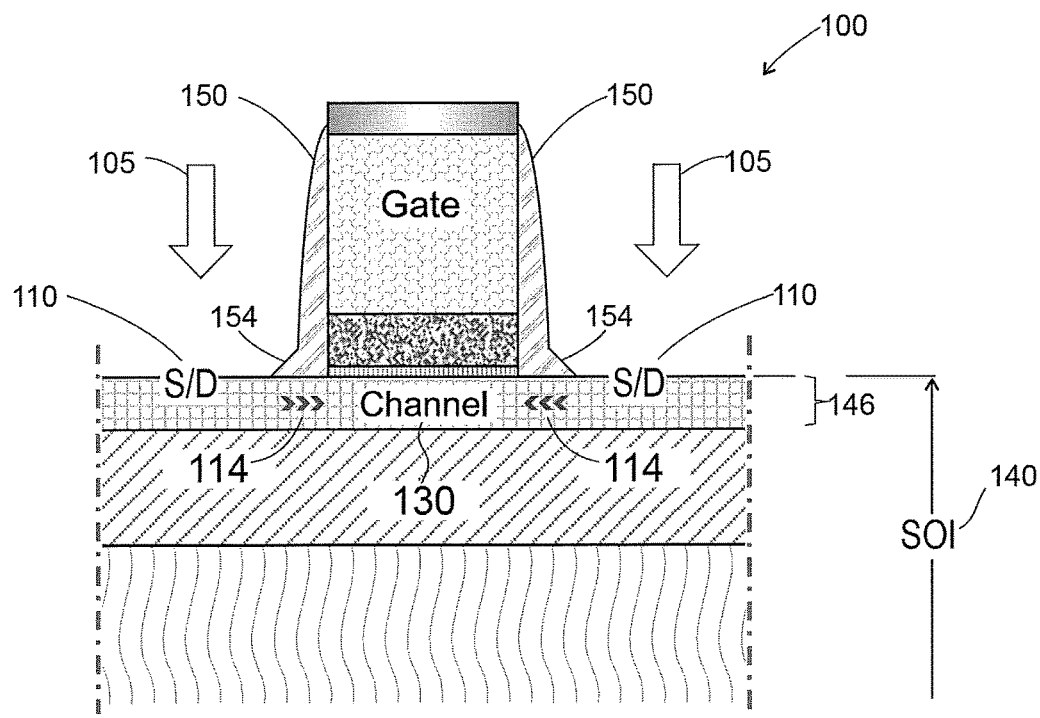
Figure 1D:
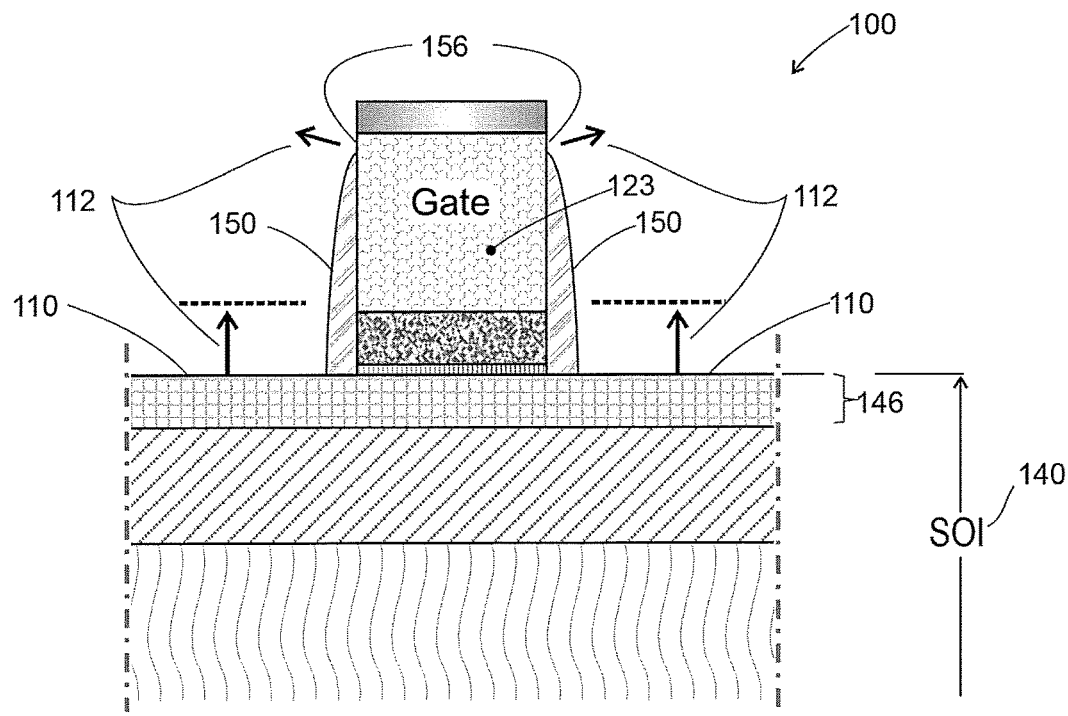
Figure 6:
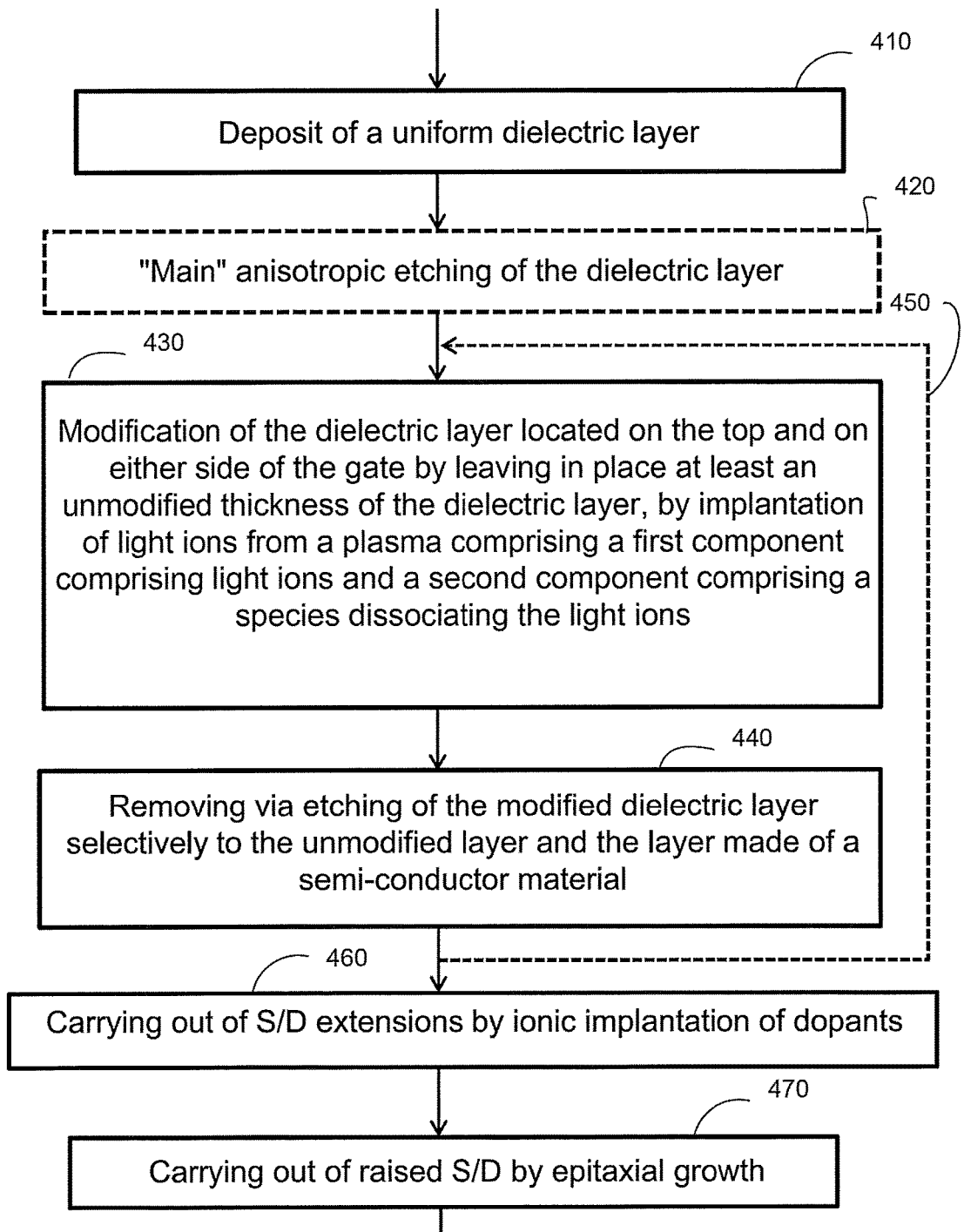
FIG. 6 summarizes the steps of an example of the method of the invention intended to form spacers and which do not induce or at the very least limit the defects described in FIGS. 1b to 1d.

FIG. 6 summarizes the steps of the method of the invention intended to form spacers and which do not induce any of the defects described in particular in FIGS. 1b, 1c and 1d for the carrying out of transistors, for example FDSOI.

After the deposition 410 via LPCVD of a uniform dielectric layer 152 over all of the surfaces of the devices being manufactured, said modified dielectric layer 158 is removed from the surfaces that are not intended to form the spacers. This removal comprises several steps, of which the steps 430, 440 and optionally the prior step 420.

As such, optionally, a conventional anisotropic dry etching 420 is carried out of the modified dielectric layer 158. This is typically carried out in a plasma of the CH3F/O2/He type described previously. The etching of the spacers is such, according to this optional and non-limiting embodiment, carried out in two steps comprising: a first step referred to a "main etching" and a second finishing step generally referred to as "over etching" (OE) that has the same meaning. It is during the step of over etching (steps 440) the removing of the dielectric material of the modified dielectric layer 158 remaining on the horizontal surfaces is finished, after having modified (step 430) the dielectric layer 152 in order to prevent or limit the problems described in FIGS. 1b to 1d.

In the framework of specific implementations of the invention, it can be decided to maintain or not the step of main etching 420, the following steps then apply either on the dielectric layer 152 such as deposited or on the remaining layer after a main etching has been carried out beforehand as in the standard method for etching spacers.

As shown in FIG. 2b, the following step 430 consists in anisotropically modifying all or a portion 154 of the remaining dielectric layer 152 by implantation of light ions. Advantageously, the second component would interact on the first component in order to dissociate the first component and favor the creation of light ions, as such increasing the concentration in H ions and the dose.

According to the applications of the method of the invention it may be preferred to use a plasma etching for the plasma implantation in particular for the following reasons: the cost of the devices is lower, the manufacturing cycle times can be shorted since the step of main etching 420 and that of modifying 430 the dielectric layer 152 can then be done in the same device without exposing to air devices that are being manufactured. Note in particular that the step of modifying 430 can be practiced in many different ways by adapting all sorts of means commonly used by the microelectronics industry, such as with the assistance of any etcher, for example in an ICP reactor "Inductively Coupled Plasma), or in a reactor of the CCP type (Capacitive Coupled Plasma) which makes it possible to control the energy of the ions. A type of plasma referred to as immersion that is commonly used to carry out an implantation of species on the surface of a device being manufactured can also be used.

In order to chose the implantation parameters those skilled in the art, in order to determine the behavior of the material to be etched in the type of plasma etcher chosen, will preferably carry out beforehand "full plate" tests in order to establish the behavior curves. They will deduce from this the implantation parameters, in particular the energy and the dose of ions, i.e. the exposure time, to be used in order to reach the desired thickness of the material to be modified.

The following step 440 is that wherein the removal by etching of the modified layer is practiced or at the very least of the modified thickness of the modified dielectric layer 158. In order to prevent the problems of the conventional methods for etching spacers described in FIGS. 1b to 1d, it is necessary for the etching of the modified dielectric layer 158 to be the most selective possible with regards to the silicon in particular in order to not attack the monocrystalline silicon of the source/drain zones with the disadvantages and consequences described hereinabove.

To do this a wet etching, for example, with a hydrofluoric acid (HF) base (or phosphoric acid (H3PO4) base) for a dielectric layer 152 with a silicon nitride base) which, as already mentioned, combines the removal of the modified dielectric layer 158 with a cleaning of the wafer containing the devices being manufactured, is advantageously used. This simplifies the method and saves time.

The thickness of the modified dielectric layer 158 is typically between a range of values from 1 nm to several tens of nm. The etching time can range from a few seconds to a few minutes. They obviously directly depend on the thickness that was modified. As an example, in order to remove a thickness of 15 nm from the modified dielectric layer 158, about 60 seconds are needed with a 1% hydrofluoric acid (HF) solution. An etching time of about 45 seconds is required with phosphoric acid (H3PO4).

The etching of the modified dielectric layer 158 will also be as selective with respect to the silicon oxide in other applications of the method as that used for carrying out the spacers of transistors of the FDSOI type where this is not useful. This is in particular the case for being able to carry out three-dimensional transistors of the FinFET type. A selective dry-etching with silicon and its oxide (Si/SiO2) could then also be practiced for this step of removing the modified dielectric layer 158.

An alternative is therefore to carry out a step of dry removing of the dielectric layer that was modified 158 by implantation, preferably, of hydrogen.

The method is that described by H. Nishini and his co-authors in a publication entitled "Damage-free selective etching of Si native oxides using NH3/NF3 and SF6/H2O down flow etching" published in the "Journal of Applied Physics" volume 74 (2), in July 1993.

The principle of dry removing of the modified dielectric layer 158 is identical to that described in the publication hereinabove. The difference is that, in the case of the invention, silicon oxide is not etched but a modified dielectric layer 158 that has been subjected to an implantation with a hydrogen base. The mechanism is however the same and comprises the following steps that are carried out in a reaction chamber where a plasma is formed, i.e. in a plasma reactor. The thicknesses treated are typically between 1 nm and a few tens of nanometers.

A first step 610 consists in generating the etching product in the plasma according to the following chemical reaction:

$$NF_3 + NH_3 \rightarrow NH_4F + NH_4F \cdot HF$$

which reacts nitrogen trifluoride ($NF_3$) with ammonia ($NH_3$) or with hydrogen ($H_2$) in order to form hydrofluoric acid (HF).

The etching is carried out during a second step 620, at a temperature of about 30° C. and more generally between 10° C. and 50° C., in the form of a formation of salts according to the following chemical reaction:

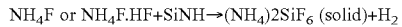
$$NH_4F \text{ or } NH_4F.HF + SiNH \rightarrow (NH_4)2SiF_6 \text{ (solid)} + H_2$$

during an operation which lasts between a few seconds and a few minutes and which is carried out under a pressure between a few milli Torr and a few Torr. More precisely, this operation lasts between 20 seconds and 2 minutes and is carried out under a pressure between 500 milli Torr and a 3 Torr.

The solid species that are formed during this operation are then sublimated 630 at a temperature above 100° C. for several tens of seconds according to the following reaction:

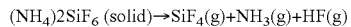
$$(NH_4)2SiF_6 \text{ (solid)} \rightarrow SiF_4(g) + NH_3(g) + HF(g)$$

For example, to remove 10 nm of the modified dielectric layer 158, the flows of nitrogen trifluoride ($NF_3$) and of ammonia ($NH_3$) are respectively 50 sccm and 300 sccm at 30° C. for 45 seconds for the step 620 of forming salts which is followed by the step of sublimation 630 which is carried out at 180° C. for 60 seconds.

This embodiment makes it possible to obtain a very good selectivity of the etching of the modified nitride with respect to the unmodified nitride and with the unmodified semiconductor material. In particular, this selectivity of the etching is much higher (typically by a factor of 10 at least) to that obtained with an HF solution.

Note here that there are etching reactors that make it possible to carry out an implantation, for example of hydrogen, using a plasma that can be followed, in the same system, with the removing of the modified dielectric layer 158 using dry etching as described hereinabove. As such, it is possible in this case to chain the cycles of modifying and of removing of the dielectric layer 152 selectively with Si or $SiO_2$, without exposing the wafer to air. This is an additional incentive for the use of an etching reactor to implement the invention rather than using a standard implanter each time that this is possible.

As already mentioned the operations for modifying 430 the dielectric layer 152 and of removing 440 the modified dielectric layer 158 can optionally be repeated 450 until the disappearance of the dielectric material of the modified dielectric layer 158 over all of the horizontal surfaces.

The following steps of the method are not different from those corresponding to standard methods where the extensions of the source/drain zones 460 are possibly carried out by ionic implantation of dopants with epitaxial growth of the raised source/drain 470 of FDSOI transistors.

The table hereinafter provides the typical conditions of implementation of the step 430 of modifying the dielectric layer 152 in the case of use of a standard plasma etching reactor. These conditions depend largely on the thickness to be modified in the dielectric layer 152. This is only a particular example of implementation of the step 430 modifying the layer to be etched. As already mentioned hereinabove, other means can be used for the implantation of the light species, H, used to modify the layer to be etched. In particular, plasmas with a high or low density or plasmas via immersion can be used. Advantageously, any type of dry etching device can potentially be used and in particular those referred to as ICP (inductively coupled plasma) or CCP (capacitively coupled plasma). These devices have the advantage of being able to carry out not only etchings, but also carbon depositions (C) in the same device.

| Etching reactor: | The values hereinbelow apply more particularly to the ICP type of etcher although any type of dry etching device can potentially be used. |
|---|---|
| Modified thickness: | from 1 nm to a few tens of nm, typically 15 nm |
| Chemistry | based on the chemistry of a first component with a hydrogen base (H2, HBr, NH3, SiH4) and on a second component: gas allowing for the dissociation of the first component with ions with a hydrogen base (H) chosen from argon, nitrogen, xenon, helium. |
| Flow rate $1^{st}$ component | 10 sccm-1000 sccm (standard cubic centimeters per minute) |
| Flow rate $2^{nd}$ component | 10 sccm-1000 sccm |
| Power of the source: | 0-2000 W |
| Polarization power: | 20 V-500 V |
| Frequency | 100 Hz-500 kHz |
| Operating cycle | 10%-90% |
| Pressure: | 5 milli-100 milli Torr |
| Temperature: | 10° C.-100° C. |
| Time: | a few seconds to several hundred seconds |

Figure 7:
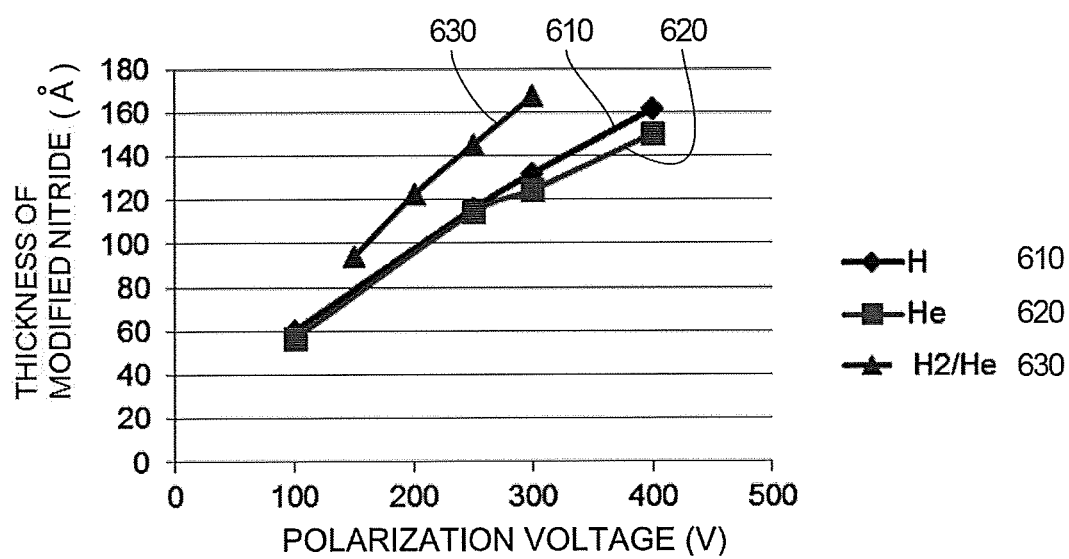
FIG. 7 gives the thickness of the modified dielectric layer according to the voltage polarization (bias) in volts for an etching of the ICP type.

FIG. 7 provides for the standard material used to form the spacers, i.e. silicon nitride (SiN) in this example, the thicknesses of modified layers obtained according to different conditions of implementation of the step of implantation of light species in a standard plasma etching reactor. FIG. 7 provides the modified thickness according to the polarization voltage (bias) in volts for an etching of the ICP type and in the following conditions, for FIG. 7: flow rate of the first component of 50 sccm; flow rate of the second component of sccm; power of the source 500 watts; pressure 10 milli Torr.

For example, in order to modify a thickness of 10 nm of silicon nitride, the ionic energy (or polarization voltage) required for a plasma formed using a first component with a hydrogen base (H2) (curve 630) combined with a second component with a helium base (He) is 150V for a time=60 s. Note that the trend observed is the same if the second component is replaced with nitrogen (N2), xenon (Xe) or argon (Ar), for example. If only hydrogen (H) (curve 610) is used to form the plasma, the polarization voltage required is then 200 V for a time of 60 s. Advantageously, the dissociation of the first component via its interaction with the second component makes it possible to increase the concentration in ions with a hydrogen base in the plasma, and therefore to increase the dose of hydrogen implanted.

According to another example, in order to modify a thickness of 16 nm of silicon nitride, the ionic energy (or polarization voltage) required for a plasma formed using a first component with a hydrogen base (H2) combined with a second component with a helium base (He) is 300V for a time=60 s. If only hydrogen (H) 610 is used to form the plasma, the polarization voltage required is then 400 V for a time of 60 s Particularly advantageously, by reducing the energy of the ions for a similar thickness of a layer of silicon nitride removed via a cleaning with a hydrofluoric acid (HF) base, the facetting of the hard mask is reduced as well as the damage that can be generated on the Si/SiGe stack, compared to a plasma formed with a hydrogen (H2) base only.

The invention is not limited to only the embodiments and examples described hereinabove, but extends to all the embodiments compliant with its spirit.

The invention claimed is:

1. A method for forming spacers of a gate of a field-effect transistor, with the gate having a top and flanks and being located above a layer of semiconductor material, the method comprising:

forming a dielectric layer covering the gate;

after the forming the dielectric layer, at least one step of modifying the dielectric layer by putting the dielectric layer into presence with a plasma creating a bombardment of light ions anisotropically along a favored direction parallel to the flanks of the gate, wherein conditions of the plasma, in particular energy of the light ions and a dose implanted being chosen so as to modify at least portions of the dielectric layer located on the top of the gate and on either side of the gate and which are perpendicular to the flanks of the gate by retaining unmodified portions of the dielectric layer covering the flanks of the gate; the light ions being ions with a hydrogen (H) base; and at least one step of removing the modified dielectric layer using a selective etching of said modified dielectric layer with respect to the layer of semiconductor material and with respect to the unmodified dielectric layer, wherein the plasma is formed from a gas comprising at least one first non-carbonated gaseous component of which dissociation generates said light ions and a second gaseous component comprising at least one species favoring dissociation of the first component in order to form said light ions, and wherein a gas ratio between the first component and the second component is between 1:19 and 19:1.

2. The method according to claim 1, wherein said gas ratio is between 1:9 and 9:1.

3. The method according to claim 1, wherein parameters of implantation, in particular implantation energy of the light ions coming from the first component and the implanted dose, are provided such that the modified dielectric layer is selectively etched with respect to the layer of semiconductor material and with respect to the unmodified dielectric layer.

4. The method according to claim 1, wherein the first component is chosen from hydrogen, silicon nitride ($SiH_4$), hydrogen nitride (NH), or hydrogen bromide (HBr).

5. The method according to claim 1, wherein the second component is chosen from helium, nitrogen, argon, or xenon.

6. The method according to claim 1, wherein the dielectric layer is formed from one or several dielectric materials of which a dielectric constant k is less than or equal to 8.

7. The method according to claim 6, wherein the dielectric layer comprises a material that has a dielectric constant less than 4.

8. The method according to claim 1, wherein the dielectric layer is a material taken from: a material with a silicon base, SiCO, SiC, SiCN, SiOCN, SiCBN, SiOCH, and $SiO_2$.

9. The method according to claim 1, wherein the dielectric layer is a porous layer.

10. The method according to claim 1,
wherein the dielectric layer is made of silicon nitride, and
wherein the forming the dielectric layer further comprises depositing the dielectric layer while reducing a dielectric constant of the dielectric layer.

11. The method according to claim 10, wherein the reducing the dielectric constant of the dielectric layer comprises one from among: introduction of a porosity into the dielectric layer, and introduction of precursors into the dielectric layer during the depositing.

12. The method according to claim 1,
wherein a flow rate of the first component is between 10 sccm (standard cubic centimeters per minute) and 1,000 sccm, and
wherein a flow rate of the second component is between 10 sccm and 1,000 sccm.

13. The method according to claim 1, wherein the modifying the dielectric layer is performed so as to provide a polarization power or a source power, at a frequency between 100 Hz (Hertz) and 5 kHz, with an operating cycle between 10% and 90%.

14. The method according to claim 1, wherein the removing the modified dielectric layer is performed by selective wet etching on the layer of semiconductor material.

15. The method according to claim 1,
wherein the layer of semiconductor material is silicon, and
wherein the removing the modified dielectric layer is performed via selective wet etching with silicon and/or with silicon oxide ($SiO_2$).

16. The method according to claim 15, wherein the selective wet etching with silicon is performed using a hydrofluoric acid (HF) solution.

17. The method according to claim 1, wherein the removing is performed by selective dry etching on the layer of semiconductor material.

18. The method according to claim 17, wherein the dry etching comprises:
a step of etching consisting in formation of solid salts; and
a step of sublimation of solid species.

19. The method according to claim 1, further comprising a single step of modifying performed so as to modify the dielectric layer in all of a thickness thereof over all surfaces parallel to a plane of a substrate whereon the gate rests, and to not modify the dielectric layer in all of a thickness thereof on surfaces parallel to the main direction.

20. The method according to claim 1, wherein the etching is selective etching with silicon oxide ($SiO_2$).

21. The method according to claim 1, wherein said gas ratio is between 1:5 and 5:1.

22. The method according to claim 1, wherein the dielectric layer is formed from one or several dielectric materials of which a dielectric constant k is less than or equal to 7.

23. The method according to claim 22, wherein the dielectric layer comprises a material that has a dielectric constant less than or equal to 2.

* * * * *